(12) United States Patent
Beyer et al.

(10) Patent No.: US 7,319,274 B2
(45) Date of Patent: Jan. 15, 2008

(54) METHODS FOR SELECTIVE INTEGRATION OF AIRGAPS AND DEVICES MADE BY SUCH METHODS

(75) Inventors: Gerald Beyer, Leuven (BE); Jean Paul Gueneau de Mussy, Elsene (BE); Karen Maex, Herent (BE); Victor Sutcliffe, Leuven (BE)

(73) Assignee: Interuniversitair Microelektronica Centrum (IMEC v2w), Leuven (BE)

( * ) Notice: Subject to any disclaimer, the term of this patent is extended or adjusted under 35 U.S.C. 154(b) by 0 days.

(21) Appl. No.: 11/387,188

(22) Filed: Mar. 22, 2006

(65) Prior Publication Data

US 2006/0177990 A1 Aug. 10, 2006

Related U.S. Application Data

(62) Division of application No. 10/957,514, filed on Sep. 30, 2004, now Pat. No. 7,078,352.

(60) Provisional application No. 60/507,613, filed on Sep. 30, 2003.

(51) Int. Cl.
*H01L 23/48* (2006.01)

(52) U.S. Cl. ............... 257/774; 257/638; 257/E23.013; 257/E21.581; 438/639

(58) Field of Classification Search ........... 257/638, 257/774, E23.013, E21.581; 438/639
See application file for complete search history.

(56) References Cited

U.S. PATENT DOCUMENTS

| | | | | |
|---|---|---|---|---|
| 6,255,156 B1 | 7/2001 | Forbes et al. | ............... | 438/235 |
| 6,268,261 B1 | 7/2001 | Petrarca et al. | ............. | 438/421 |
| 6,342,722 B1 | 1/2002 | Armacost et al. | ........... | 257/522 |
| 6,387,818 B1 | 5/2002 | Lopatin | ...................... | 438/723 |
| 6,492,245 B1 | 12/2002 | Liu et al. | .................... | 438/422 |
| 6,589,861 B2 * | 7/2003 | Park et al. | .................. | 438/619 |
| 6,599,814 B1 | 7/2003 | Vanhaelemeersch et al. | ..... | 438/421 |
| 2002/0055243 A1 | 5/2002 | Lee | ............................ | 438/586 |
| 2002/0127844 A1 | 9/2002 | Grill et al. | .................. | 438/622 |

OTHER PUBLICATIONS

European Search Report for EP 04 44 7219.9, application of Interuniversitair Micro-Elektronica Centrum, dated Feb. 9, 2005. Includes Abstract.
European Search Report for EP 04 44 7220.7, application of Interuniversitair Micro-Elektronica Centrum, dated Feb. 9, 2005. Includes Abstract.

* cited by examiner

*Primary Examiner*—George R. Fourson
*Assistant Examiner*—Julio J. Maldonado
(74) *Attorney, Agent, or Firm*—McDonnell Boehnen Hulbert & Berghoff LLP

(57) ABSTRACT

Methods for the production of airgaps in semiconductor devices and devices produced using such methods are disclosed. An example semiconductor device includes a damascene stack formed using such methods. The damascene stack includes a patterned dielectric layer including an interconnect structure, where the dielectric layer is formed of a dielectric material including Si, C and O. The damascene stack also includes a converted portion of the dielectric layer, where the converted portion is adjacent to the at least one interconnect structure and has a lower carbon content than the dielectric material. The damascene stack also includes an airgap formed adjacent to the interconnect structure, the airgap being formed by removing at least part of the converted portion using an etch compound.

20 Claims, 17 Drawing Sheets

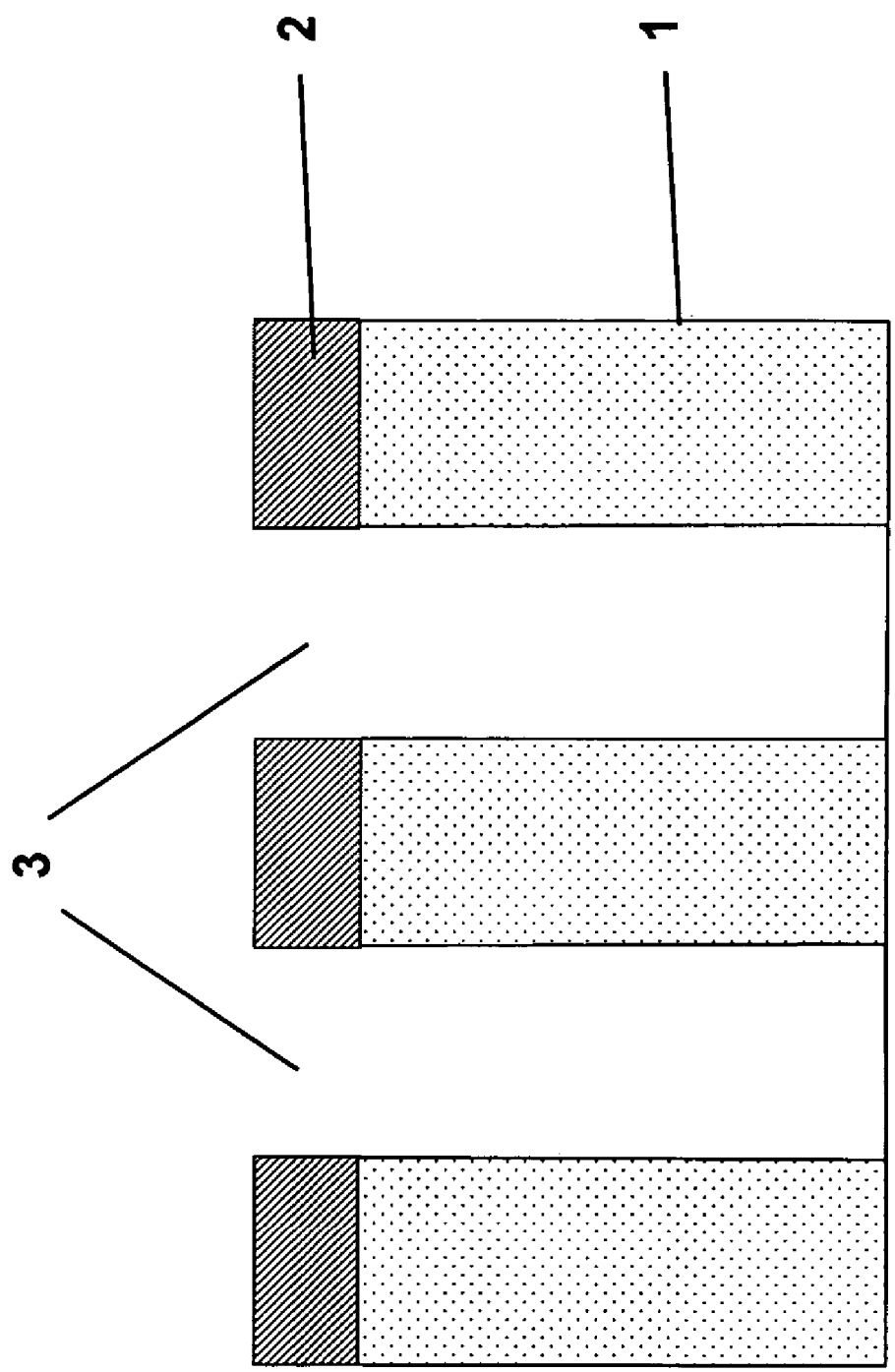

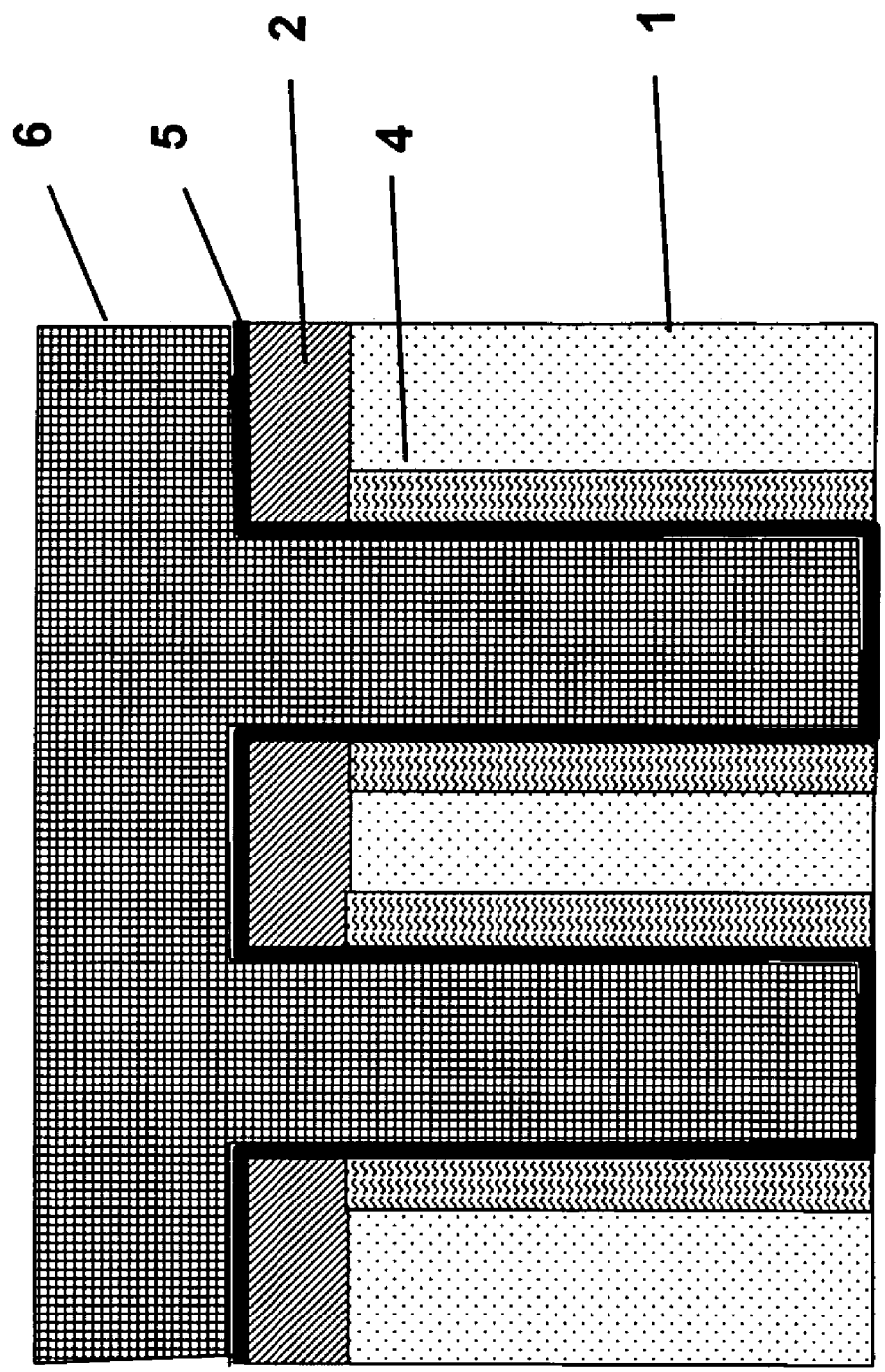

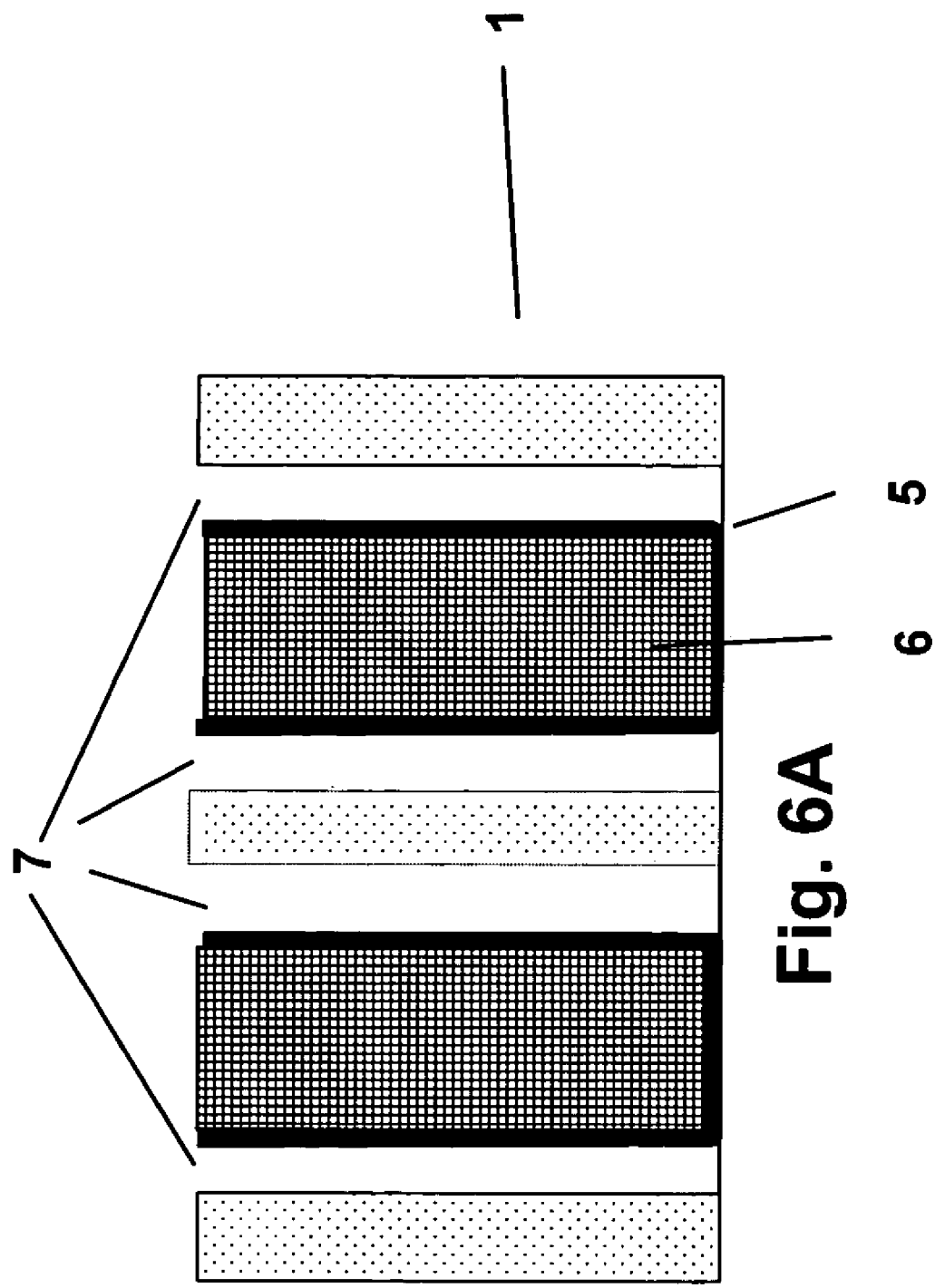

(a) Dry etch and strip

▒ SW damage (b) Ta(N) & Cu deposition and CMP (d) Deposition of passivation layer (c) HF dip

METHODS FOR SELECTIVE INTEGRATION OF AIRGAPS AND DEVICES MADE BY SUCH METHODS

CROSS REFERENCE TO RELATED APPLICATIONS

This application is a divisional of U.S. patent application Ser. No. 10/957,514, filed on Sept. 30, 2004, now patent No. 7,078,352. U.S. patent application Ser. No. 10/957,514 claims benefit, under 35 U.S.C. § 119(e), of U.S. Provisional Patent Application No. 60/507,613, which was filed on Sept. 30, 2003. The entire disclosures of U.S. patent application Ser. No. 10/957,514 and U.S. Provisional Application No. 60/507,613 is-are incorporated herein by reference.

FIELD

This invention is related to the field of semiconductor processing and, more specifically, to the production of micro and nano-electromechanical systems (MEMS, NEMS) and low dielectric constant isolation for interconnects.

BACKGROUND

Airgaps are currently employed in semiconductor devices, such as integrated circuit (IC) devices as both structural or functional (e.g., circuit) element. Also, airgaps in the form of cavities may be present in MEMS and NEMS devices. The use of airgaps is considered to be very promising in the technology area of circuit interconnects, where airgaps may be used as a dielectric for isolation of such interconnects. As the geometries of IC technologies scale down, interconnects are becoming one of the major limiting factors of improved signal propagation delay times, reduced dynamic power consumption and reduction of signal errors resulting from cross-talk effects between adjacent metal lines. Some improvement has been realized by the semiconductor industry's transition from the use of aluminum to the use copper as an interconnect material. This has change has resulted in a reduction in the resistance of IC interconnects, and thus improvements in propagation delays and reductions in dynamic power consumption.

A current focus in the semiconductor industry is to achieve better isolation between the interconnect lines through the introduction of materials with lower dielectric constant than that of silicon oxide (k=4.2) in order to reduce the capacitance (C) between lines. However, the integration of low-k materials (k<3.0) into IC production processes creates a number of challenges associated with leakage, mechanical instability and joule heating, increasing the overall cost of future IC processes. Additionally, the barrier and intermediate layers that employed in such processes tend to increase the effective permittivity of the final stack, which is undesirable from a circuit performance standpoint.

The dielectric and electrical insulation properties of air makes the integration of airgaps as isolation between metal interconnect lines in IC device desirable in order to address some of the concerns discussed above. In fact, the approach of using of air as a dielectric to isolate electrical interconnects has been employed to reduce resistive-capacitive (RC) delay, as well as to reduce dynamic power consumption and signal errors (e.g. due to cross-talk between adjacent metal lines).

One approach that has been used to introduce air cavities into IC devices involves isotropic etching of a device. Such a process has been employed in the production of MEMS devices. This approach includes using hydrofluoric acid (HF) to dissolve a sacrificial SiO2 layer. In such a technique, a film that is relatively non-reactive with HF (e.g., SiC) is employed as an etch stop. The etch source is then sealed by a non-conformal CVD SiO2 layer.

Another approach for the introduction of air cavities is the use anisotropic etching. This approach includes eliminating material using an anisotropic dry etch. A mask is then used as part of the dry etch and strip operations. Subsequently, a conformal CVD SiO2 film, followed by a non-conformal CVD SiO2 film, is deposited on top of the lines to be used for the creation of airgaps.

U.S. Pat. No. 6,268,261 describes a process for manufacturing a semiconductor circuit that includes the use of airgaps. This process includes creating a plurality of adjacent conductive lines with a solid fill material between the conductive lines. One or more layers are formed above the lines and the fill material and one or more pathways to the fill material are formed through the layers formed above the lines and the fill material. The fill material is then converted to a gas that escapes through the pathways. This process leaves air voids between adjacent lines. The process results in a multi-layer semiconductor circuit with conductive lines, where the lines have airgaps (or voids) as a dielectric between them. This process has certain drawbacks, however. For example, the solid fill material needs to be deposited between the conductive lines. This fill material must be stable during deposition of the layers on top and be of a composition that is easily convertible to a gas. Further, in designing such circuits, the layers on top of a pathway need to be accounted for. Therefore, such an approach involves research and development of fill material compositions, circuit design considerations, and additional manufacturing operations, such as extra masking and etching steps.

SUMMARY

Methods for integrating airgaps in a semiconductor device and devices produce by such methods are disclosed. One embodiment of such a semiconductor device includes a stack of layers. The stack of layers includes at least a first dielectric layer made of a first dielectric material and a second dielectric layer made of a second dielectric material. The second dielectric layer is situated on top of the first dielectric material. The first dielectric layer is resistant to a first etching substance and, in certain embodiments, the second dielectric layer is also resistant to the first etching substance.

A method for forming (integrating) airgaps may be employed to form such airgaps in a stack of layers of a semiconductor device, the stack of layers including a first dielectric material, which is resistant to a first etching composition and a second dielectric material situated on top of the first dielectric material. The method comprises etching at least one hole in the stack of layers with a second etching composition. The method further includes chemically and/or mechanically converting, at least locally, the sidewalls of the hole(s) in the dielectric material into a dielectric material that is etchable by the first etching composition. The method also includes depositing an electrically conductive material in the hole(s) and removing the overburden of the conductive material so as to expose the converted dielectric material.

The first etching composition is then contacted with the converted dielectric material in order to remove the converted material. The first dielectric material may be a (hydrogenated) silicon oxycarbide (SiCO:H) material and is more porous than the second dielectric material in order to promote more rapid conversion of the first dielectric material relative the second dielectric material.

The step of etching at least one hole in the stack of layers, and chemically and/or mechanically changing the properties of the first dielectric layer locally to form a dielectric layer that that is etchable by the first etching composition may be done as a single operation, such that the sidewalls of the hole(s) in the first dielectric layer are converted during the formation of the hole(s). In such an approach, the conversion of the first dielectric layer results from a loss (or depletion) of carbon out of the first dielectric material. This loss of carbon results in an at least a partially carbon depleted, or completely carbon depleted dielectric material being formed at least locally in said first dielectric layer (e.g., on the sidewalls of the hole(s)).

The method then includes depositing a layer of electrically conductive material in the hole(s). In certain embodiments, a barrier layer may also be deposited before the conductive material, where the barrier layer acts as a diffusion barrier for the first etching substance. A subtractive technique is then applied on the stack of layers to expose the converted dielectric material at the surface of the stack of layers and to create at least one line of conductive material.

The stack of layers is then subjected to the first etching substance to form airgaps around the line(s) of conductive material. Various etch species may be used, such as an aqueous hydrofluoric acid (HF) solution.

In this method for the production of airgaps in a semiconductor device, the stack of layers includes a first dielectric layer made of a first dielectric material and a second dielectric material. The layer stack may further include a hardmask or metal hardmask on top of said stack of layers. In another alternative approach, the second dielectric layer is not included in the stack of layers and a hardmask or metal hardmask is situated on top of the first dielectric layer.

BRIEF DESCRIPTION OF THE DRAWINGS

Various embodiments are described herein with reference to the following drawings. Certain aspects of the drawings are depicted in a simplified way for reason of clarity. Not all alternatives and options are shown in the drawings and, therefore, the invention is not limited in scope to the content of the drawings. Like numerals are employed to reference like parts in the different figures, in which:

FIGS. 1A to FIG. 6B are drawings illustrating various processing steps of methods for integrating airgaps into a semiconductor device layer stack, FIGS. 3A, 4A, 5A and 6A show partial airgap formation for adjacent Cu lines, while FIGS. 3B, 4B, 5B and 6B show substantially complete removal of the dielectric material between two adjacent Cu lines leaving only an airgap between the adjacent Cu lines;

DETAILED DESCRIPTION

The following description illustrates various embodiments of methods for producing semiconductor devices using airgaps for isolation and embodiments of devices produced by such methods. It will be appreciated that there are numerous variations and modifications of these embodiments that are possible. Accordingly, the description of the various embodiments should not be deemed to limit the scope of the invention, which is defined by the claims.

Overview

Methods for the selective integration of airgaps in a stack of layers of a semiconductor device and devices produce by such methods are disclosed. In one embodiment of such a device, the stack of layers includes a first dielectric material, which is resistant to a first etching composition, and a second dielectric material which is disposed upon the first dielectric material. A first etching composition is used to open a hole in the first and second dielectric materials, in which a conductive layer is deposited.

An embodiment of selectively integrating airgaps in this device (e.g., around a metal line an/or vias formed with the conductive layer) includes etching, with a second etching composition, at least one hole in said stack of layers. The method also includes converting, chemically and/or mechanically, at least locally, the sidewalls of the hole(s) in the dielectric material into a dielectric material that is etchable by the first etching composition. This method still further includes depositing in an electrically conductive material in the hole(s). The overburden of the conductive material is removed, so as to expose the converted dielectric material. The first etching composition is applied to the stack of layers so that it contacts and removes the converted material.

Methods for Selectively Integrating Airgaps and Device Produced Therefrom

Figure 1:
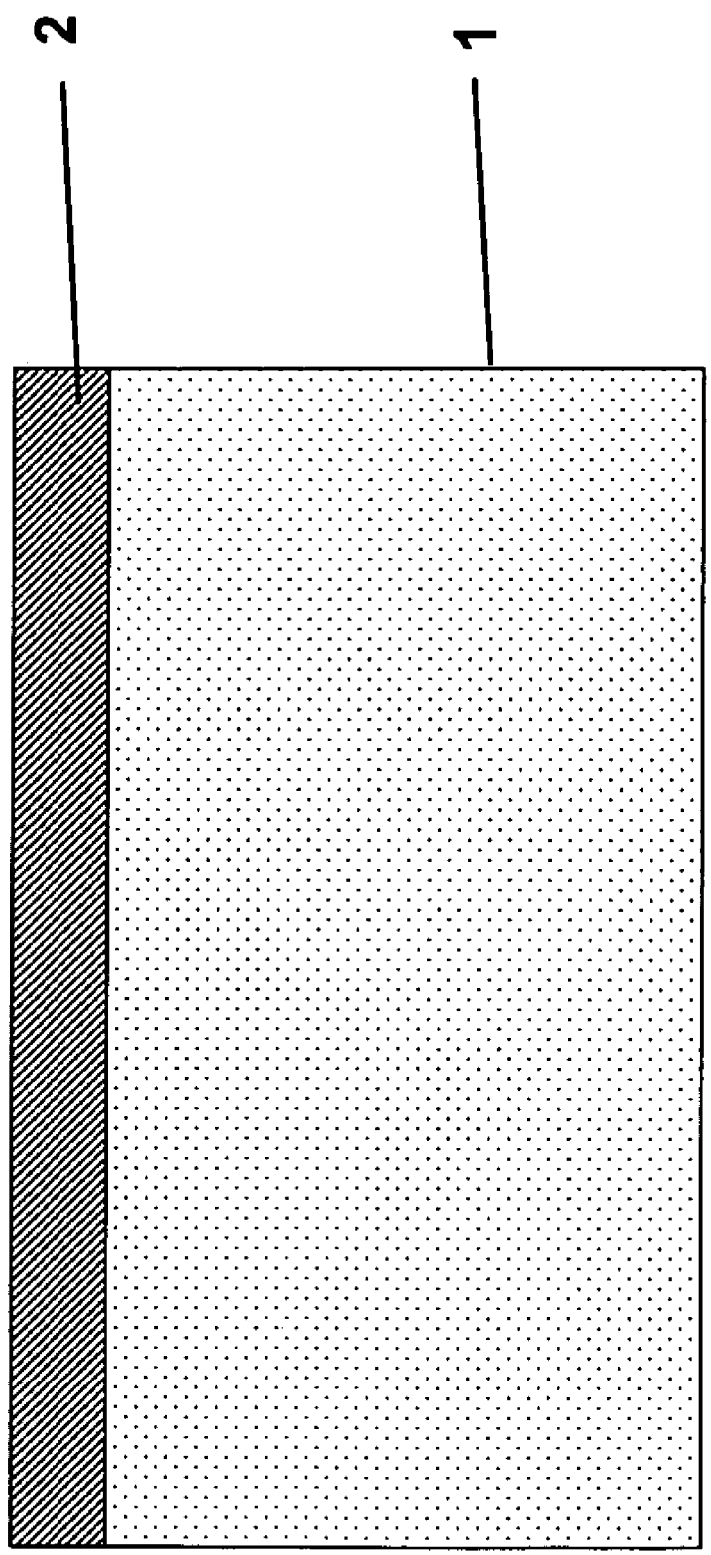

Methods for selectively integrating airgaps are illustrated by FIG. 1-FIG. 7D. Referring to FIG. 1, a first dielectric material 1 is deposited on a Si substrate (not shown) or any other suitable substrate. The dielectric material 1 may deposited using any appropriate method, such as Plasma Enhanced Chemical Vapor Deposition (PECVD), Chemical Vapor Deposition (CVD) or spin-on deposition, among other possible techniques. On top of the dielectric material 1 another dielectric material 2 is deposited by, for example, any of the methods which were just described for the dielectric material 1. One function of the dielectric material 2 is to protect the field region of dielectric 1 from plasma conversion, which is discussed in further detail below with reference to FIGS. 3A and 3B.

The dielectric material 1 may take the form of an Organo Silicate Glass (OSG), which are also commonly referred to as SiOC:H materials, (hydrogenated) silicon oxycarbides or Carbon doped oxides (including higher porosity derivatives). The class of MethylSilsesQuioxane (MSQ) is another example of a material that may be used for the dielectric material 1. Such materials may be characterized by a Si backbone which is carbon doped. Materials of this type are commercially available, such as under the names Black Diamond (referred to as BD), Coral or Aurora. The dielectric material 2 may take the form of $SiO_2$ or SiC or SiCN.

The dielectric materials 1 and 2 may be the same type of material. However, it is desirable situation that they have different porosity. For example, in the situation where both the dielectric materials 1 and 2 are SiCO:H materials, the material 2 is desirably of a lower porosity, such that less plasma conversion will take place and the dielectric material 2 can maintain its integrity, so as protect the field region of the dielectric material 1. A lower porosity SiCO:H material is desirable because that material will be less susceptible to conversion due to an $O_2$ containing plasma (e.g., the second etching composition). A higher porosity SiCO:H material contains more carbon and, thus, more carbon will be removed in the presence of an $O_2$ containing plasma.

Hardmasks (e.g., metal or otherwise) may also be used as an alternative material for the dielectric material 2, or may be used on top of the dielectric material 2 to act as hardmask for the anisotropic etching operation. Metal hardmask are hardmasks containing metals. Examples of materials that may be used to form metal hardmasks are TaN, WCN, WN and TiN. Alternatively, a hardmask may be formed from one or more of $SiO_2$, SiC, SiN and SiC(N). Alternatively, SiOC, MSQ and HSQ materials may be used as hardmask layer, as long as the particular materials employed have densities higher than the dielectric layer 1 or 2 under said hardmask layer in the stack of layers Referring now to FIG. 2A, two holes 3 are formed (e.g., etched) into the dielectric stack shown in FIG. 1. The location of the holes 3 may be defined by transferring a resist pattern (not shown here) onto the dielectric stack using an etch plasma. The remaining resist and polymers (not shown here) are then removed by a combination of dry ash plasma and wet strip. The (metal) hardmask and/or the dielectric material 2 protects the field region of the dielectric material 1, such that no conversion of the dielectric material 1 at the field takes place.

Figure 3A:
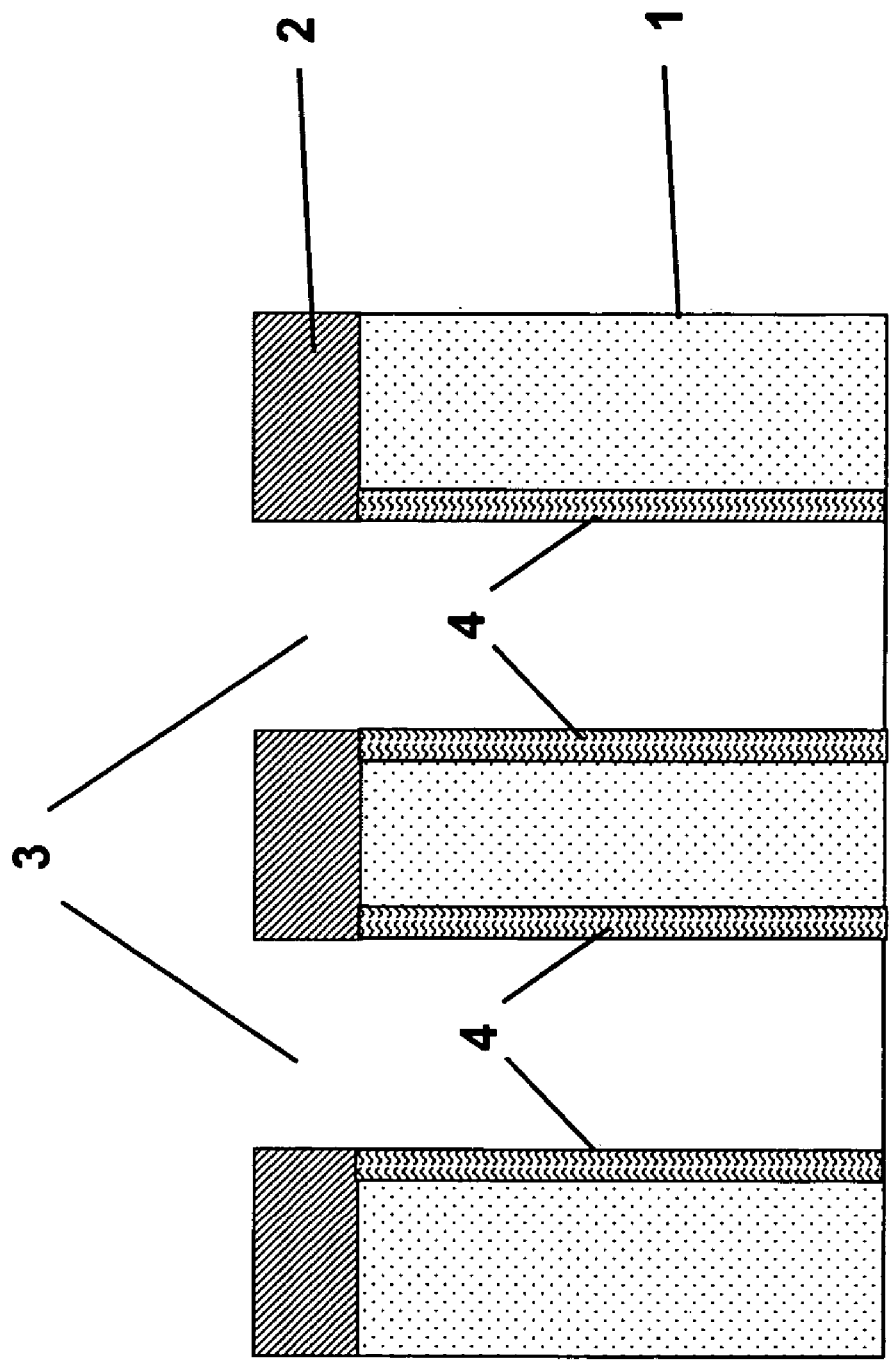
Figure 3B:
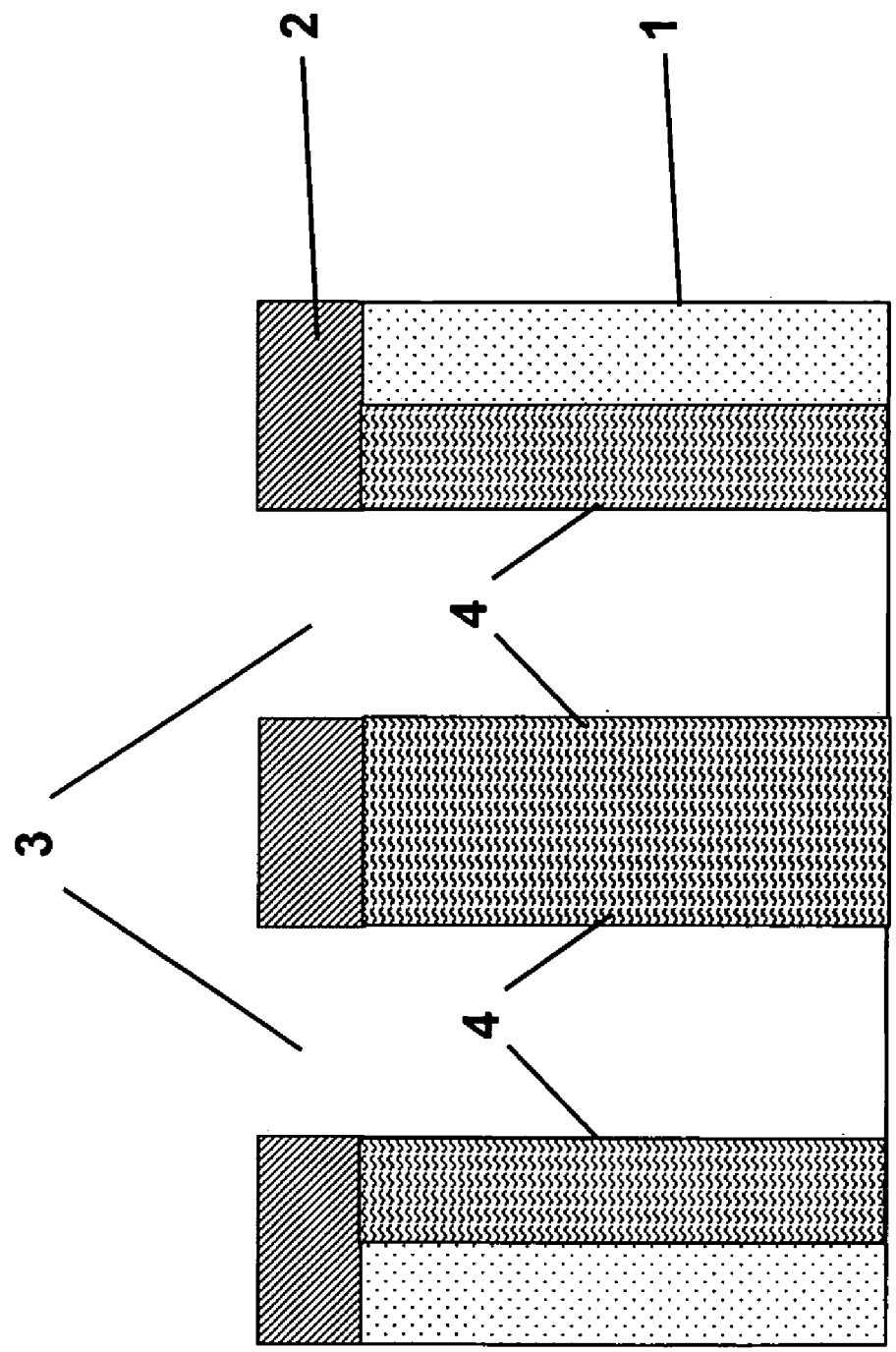

The etch plasma and/or ash plasma may cause some local conversion of dielectric 1 into a modified dielectric 4, as is illustrated in FIGS. 3A and 3B. This converted portion of the dielectric material 1 is more readily removable during a later the stage of processing, where another etch species is applied to the layer stack. Local conversion of the dielectric material 1 may alternatively been achieved using a separate operation, rather than during the dry ash plasma operation.

In certain embodiments, the conversion of the dielectric material 1 (such as for SiCO:H materials) to the converted dielectric material 4 is accomplished by oxidation of the dielectric material 1. This oxidation causes the removal (e.g., depletion) of carbon out of the dielectric material 1 (such as in the form of carbon dioxide).

A plasma treatment, which may or may not be the same plasma treatment used to etch a hole in the dielectric material, converts the sidewalls of dielectric 1 in the hole 3 into the converted dielectric 4, as is illustrated by FIGS. 3A and 3B. This plasma treatment may be the same plasma treatment used to form the holes 3. Alternatively, a plasma treatment such as a UV-ozone, a super critical carbon dioxide (SCCO2) or a combination of such techniques, or other techniques may be used to convert the dielectric material 1 to the dielectric material 4. The plasma treatment applied to effect the conversion leads to a reduced carbon concentration in the converted dielectric material 4 as compared to the unconverted dielectric material 1.

In the case where the dielectric material 1 is an SiCO:H material, the converted dielectric material 4 is a carbon depleted SiCO:H material. The extent of the conversion of dielectric material 1 to the dielectric material 4 depends on the type of SiCO:H material used for the dielectric material 1 and, more specifically, on the porosity and carbon content of the SiCO:H material. In case of substantially complete carbon removal from a SiCO:H material, the resulting converted semiconductor material 4 is referred to as a $SiO_x$ material. A SiOx film corresponds to a Si (silicon) and O (oxygen) containing film, where both elements are not stoichiometrically related. This type of film typically has numerous defects and is less cross-linked as compared to a $SiO_2$ film. Because the $SiO_x$ material is less cross-linked it is, therefore, more susceptible to HF etching (during the removal process).

The conversion of the dielectric material 1 into the converted dielectric material 4 may be performed contemporaneously with the dry etching of the dielectric material 1 and/or ashing using an oxidizing plasma for forming the holes 3. In such an approach, the etching of the holes 3 is accomplished using an anisotropic plasma etch, where the plasma is an oxidizing plasma.

Alternatively, the conversion of the first dielectric material 1 to the converted dielectric material 4 may be performed after the step of etching the holes 3 in the first dielectric material 1, such as in an oxidizing environment. In this situation, the conversion step may be accomplished using an UV/ozone treatment with addition of an oxidizer or a SCCO2 treatment with addition of an oxidizer.

As yet another alternative, the conversion of the first dielectric material 1 to the converted dielectric material 4 may also be realized using an inert gas plasma and ion bombardment. Such treatment will also lead to carbon depletion in the first dielectric material 1. This conversion may be termed as a mechanical conversion because no chemical reaction, such as oxidation is involved.

The converted dielectric material 4 has in-plane dimensions smaller than 1am, smaller than 500 nm or smaller than 100 nm. Further, the lateral depth of the conversion of the dielectric material 1 is controlled by the plasma or alternative conversion process employed and is also affected by the porosity of the dielectric material 1. Thus, by modifying these factors, substantially complete conversion (as in FIG. 3b) or partial conversion (as in FIG. 3A) of the dielectric material 1 between two or more neighboring trenches (metal lines) is possible.

Figure 4B:
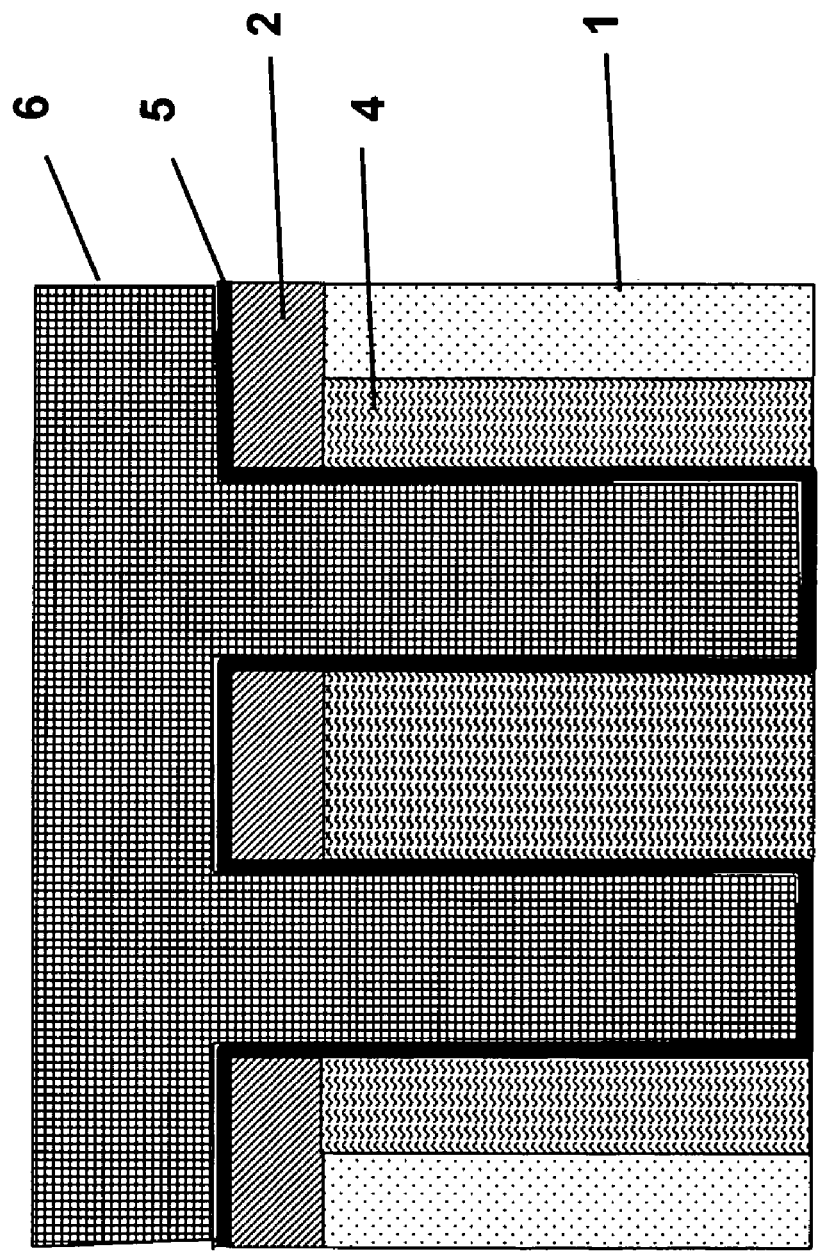

Referring now to FIGS. 4A and 4B, the process of lining the sidewalls of the hole and the field a barrier layer 5 is illustrated. The barrier layer 5 may be deposited using Physical Vapor Deposition (PVD), Chemical Vapor Deposition (CVD), Metal Organic Chemical Vapor Deposition (MOCVD), Atomic Layer Deposition (ALD), or any other appropriate technique. Examples of materials that may be used for the barrier layer 5 are TaN, Ta, TiN, Ti, WN and WCN. The barrier layer 5 can act as diffusion barrier for HF during the formation of the airgaps.

Figure 5A:
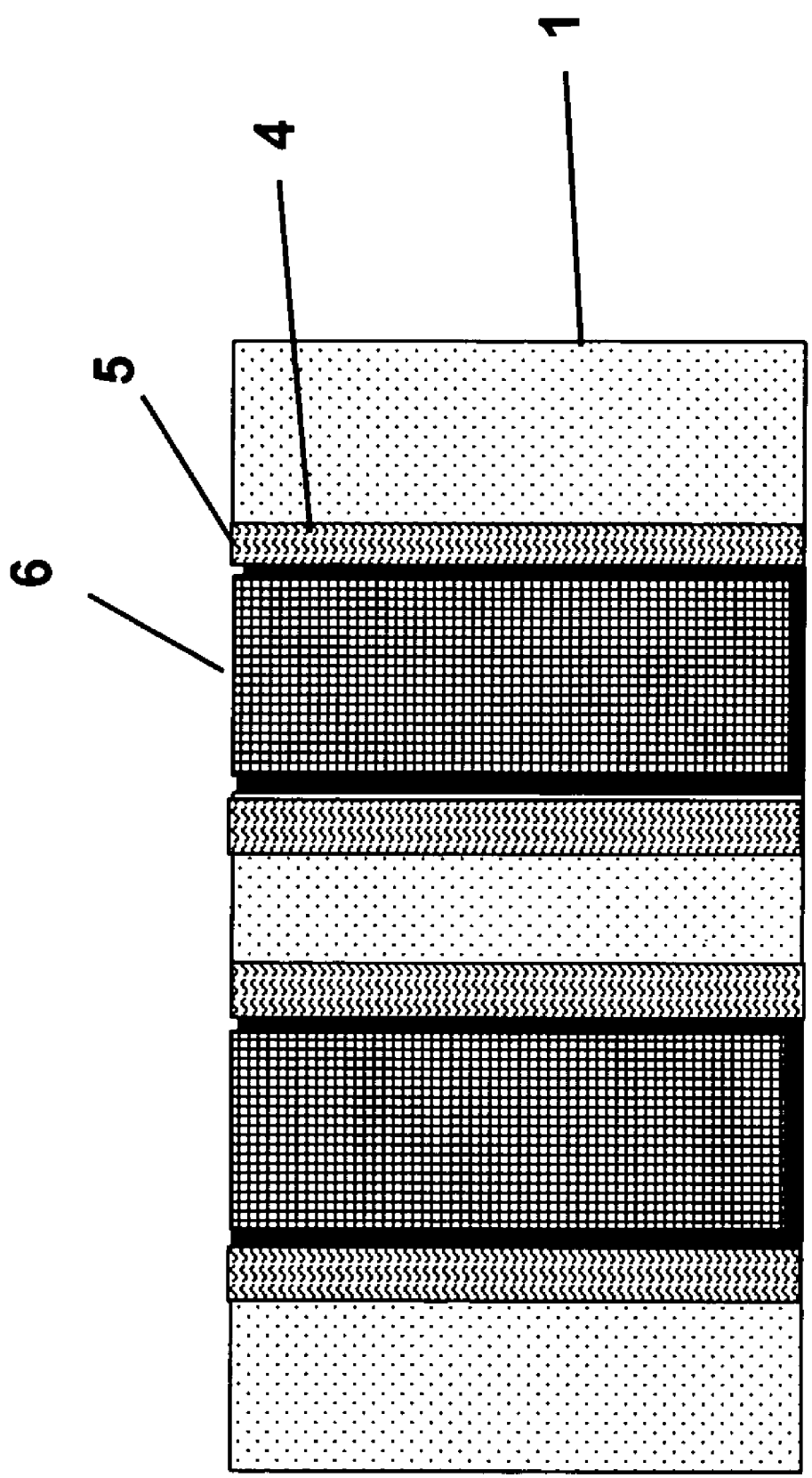
Figure 5B:
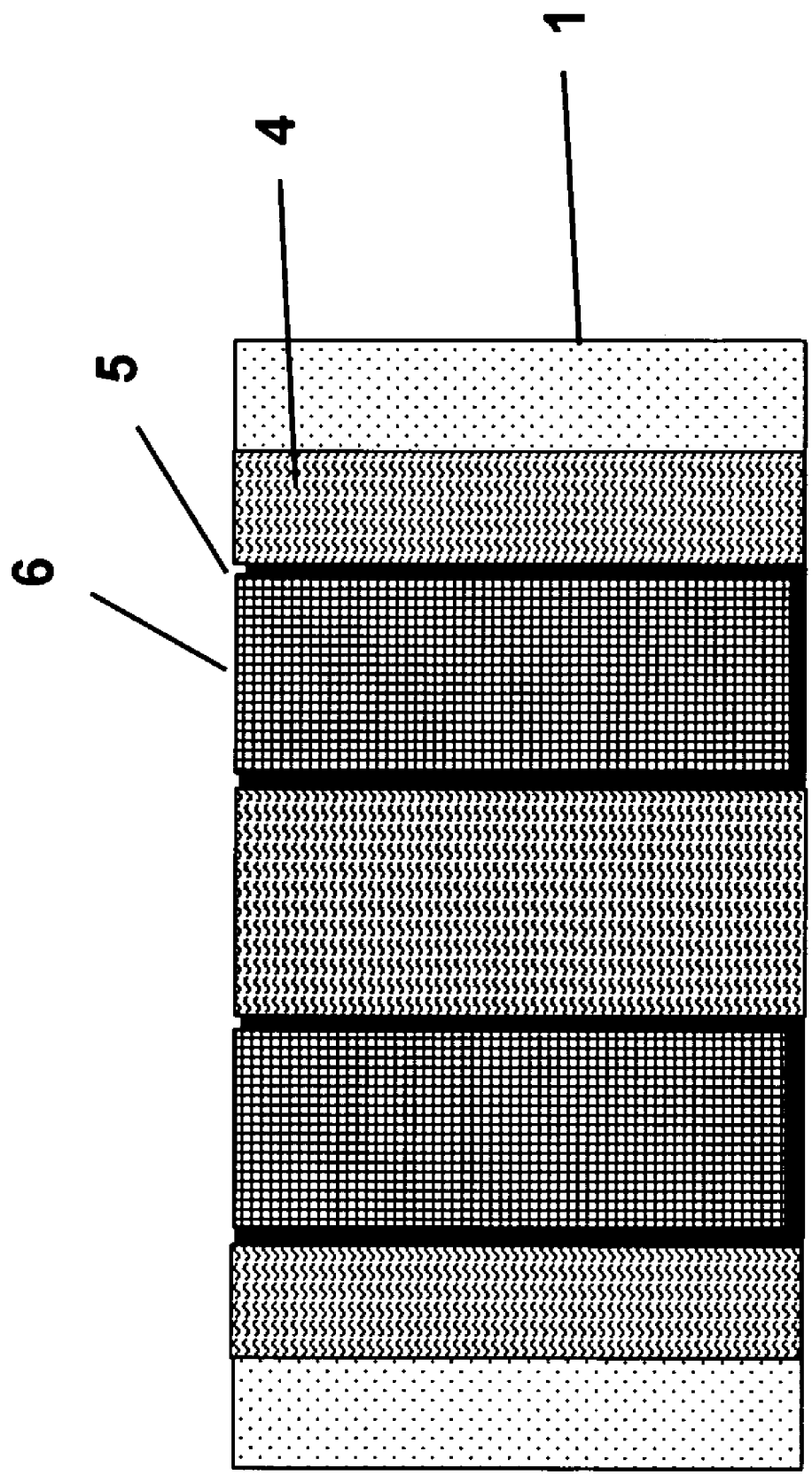

The hole 3 is then filled with a conductive material 6, for example Cu, Au or Ag. Of course, conductive materials may be used, such as other metals, carbon nanotubes, carbon annotates and conductive polymers. The overburden of the conductive material, for example the overburden of Cu, and the overburden of any barrier layer on the field of the dielectric material 1 are removed by a subtractive technique. As is illustrated by FIGS. 5A and 5B, such subtractive technique are employed to only leaves the barrier layer 5 and the conductive material 6 that is within the hole in place. Any number of subtractive technique may be used, such as Chemical Mechanical Polishing (CMP), Electro Polishing, etch or any combination of these or other appropriate techniques. Additionally, the subtractive techniques may also remove the dielectric material 2, as shown in FIGS. 5A and 5B.

The conductive material 6 formed in the holes in the stack of layers may be horizontal lines (also referred to as "trenches") or vertical structures (also referred to as "vias"). The vias and trenches are part of a (single or dual) damascene structure that is formed during "end of line" processing a semiconductor device. The airgaps that are created in a damascene structure may be formed near the vias and/or the trenches of the structure. However, leaving the dielectric material 1 intact near the via structures may provide more mechanical support and stability for the damascene structure.

Figure 6B:
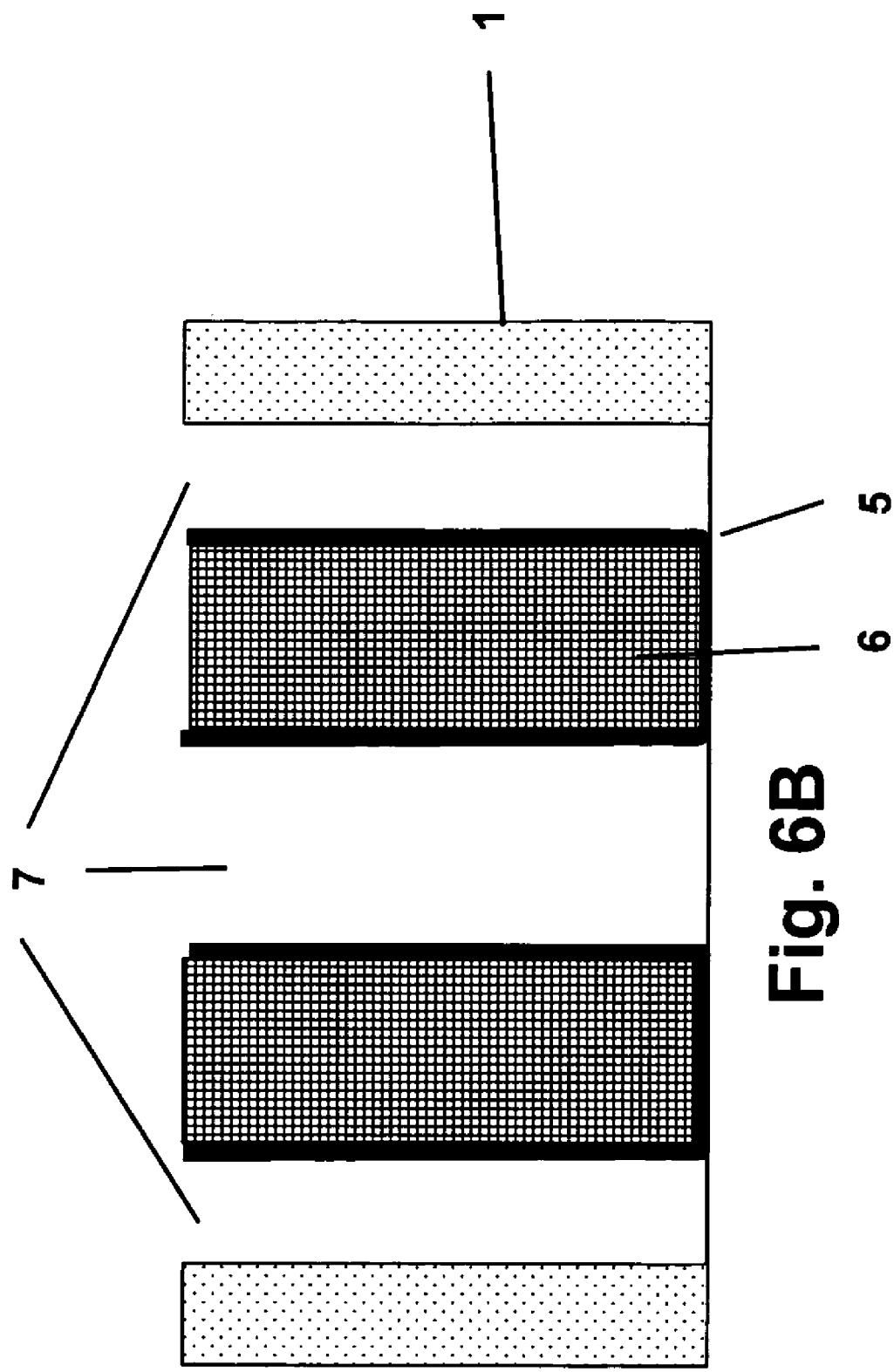

The converted dielectric material 4 is then removed using an etch medium that is highly selective of the converted dielectric material 4 over the unconverted dielectric material 1. (e.g., etches the converted dielectric material 4 more rapidly). This etch selectivity is illustrated by FIGS. 6A and 6B. In this example, the removal of the converted dielectric material 4 is accomplished using an HF treatment. The HF treatment may be applied in any number of ways. For example, the converted dielectric material 4 may be exposed to vapor HF (VHF) or by dipping the layer stack (e.g., in wafer or die form) in a liquid HF solution. For example, an aqueous HF solution that contains less than 5% HF, less than 2% HF or around 1% HF may be used. Such solutions may have other HF concentrations and be prepared with/without additives, such as methanol. As another alternative, the layer stack may be subjected to a Super Critical $CO_2$ (SCCO2) environment with the addition of HF.

Using such techniques, substantially complete removal of the converted dielectric material 4 will take place in smaller interconnect geometries (smaller interline spacing), such that the airgaps span substantially the complete width between 2 neighboring lines, as is shown in FIG. 6B. For example, substantially complete removal of the converted dielectric material 4 is possible in the case where two adjacent conductive (e.g., Cu) lines are spaced on the order of 50 nm from each other.

For this particular technique, the duration of the process of chemically and/or mechanically changing the properties of the first dielectric layer locally has a greater effect on the formation of airgaps than the duration of the applying the first etching substance To dissolve the first dielectric material around the conductive material 6. It will be appreciated that the process of chemically and/or mechanically changing the properties of the first dielectric layer locally will determine which area will be etched by the first etching substance, when applied.

The distance at which neighboring conductive lines may be place is determined, in part, by the limitations of techniques for forming neighboring holes in the stack of layers. Currently, metal lines are spaced at about 100 nm. The methods, devices and techniques described herein are relatively scaling invariant and are currently limited to any particular distance between conductor lines, as chemically and/or mechanically changing the properties of the liner layers locally may be readily accomplished on a nanometer scale and smaller.

If the distance between neighboring conductor lines is approximately 100 nm or less, it is possible to remove all the intermediate dielectric material and leave only an airgap in between. Such an approach is illustrated by FIGS. 3B, 4B, 5B and 6B. For distances larger then 100 nm, some dielectric material is left between the lines in order to provide mechanical support for the deposition of further layers on the top of the airgap structure described herein.

Figure 13A:
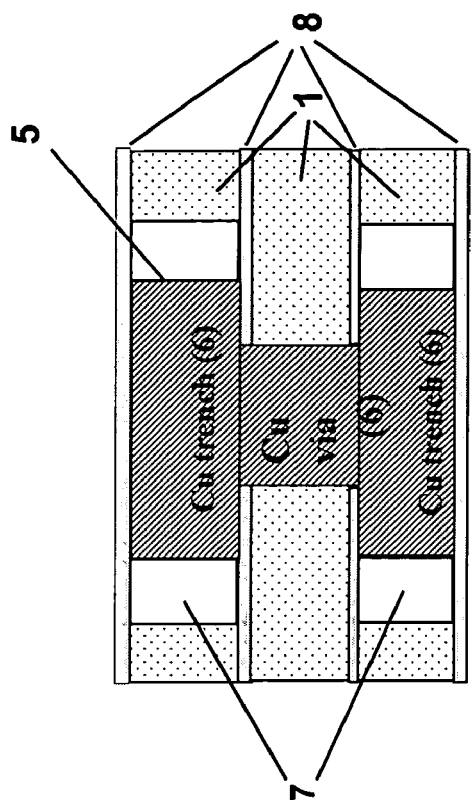
FIGS. 13A-13C are drawings illustrating a Dual Damascene (DD) interconnect structure with airgaps formed in the dielectric material (i) near both vias and trenches as shown in FIG. 13A, (ii) near just the trenches as shown in FIG. 13B, and (iii) near the vias as shown in FIG. 13C.
Figure 13B:
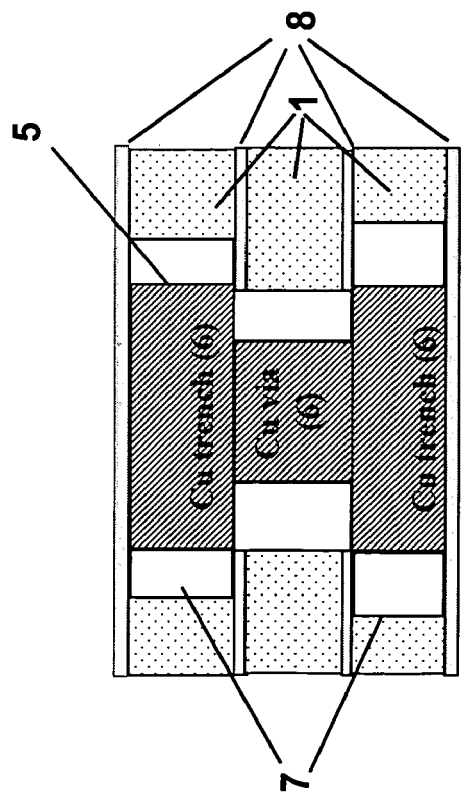
Figure 13C:
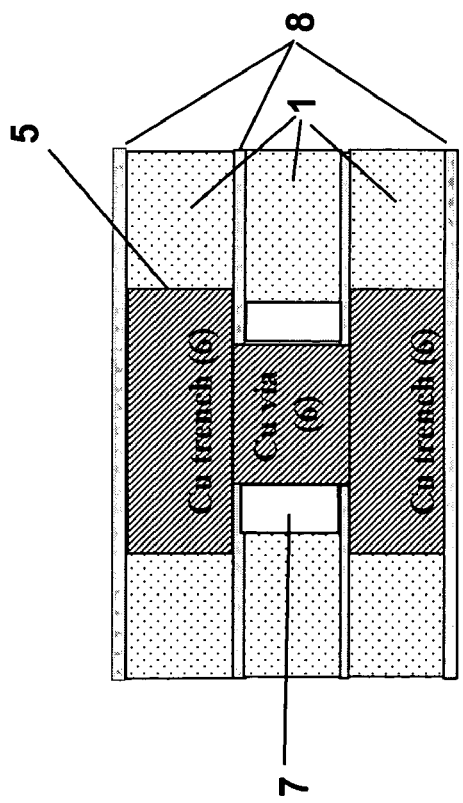

In certain embodiments, the methods described above may be repeated; such as forming new layers on top of an airgap structure. In a Dual Damascene (DD) interconnect structure, as illustrated in FIGS. 13A-13C, airgaps (7) are formed in the dielectric material near the vias (as shown in FIG. 13(c)), near the trenches (as shown in FIG. 13(b)) or both (as shown in FIG. 13(a)). Most preferred is the formation of airgaps near the trenches and leave original dielectric material (1) near the via structure. Leaving the original dielectric material (1) near the via structures will give more mechanical support to the Dual Damascene structure.

EMPIRICAL EXAMPLES

Example 1

Figure 10A:
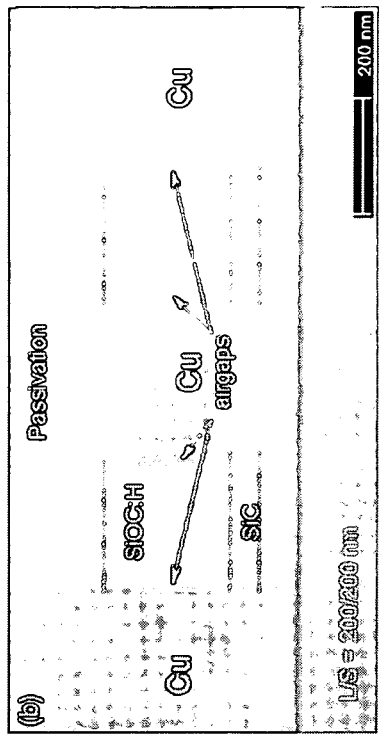
FIGS. 10A-10C are cross-sectional SEM images of Cu/Low-k/Airgaps/Passivation structures with interline spacing of L/S=(FIG. 10A) 150/150 nm, (FIG. 10B) 200/200 nm and (FIG. 10C) 250/250 nm.
Figure 10B:
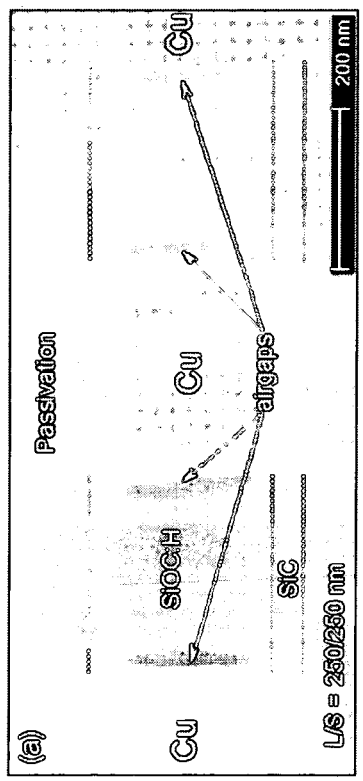
Figure 10C:
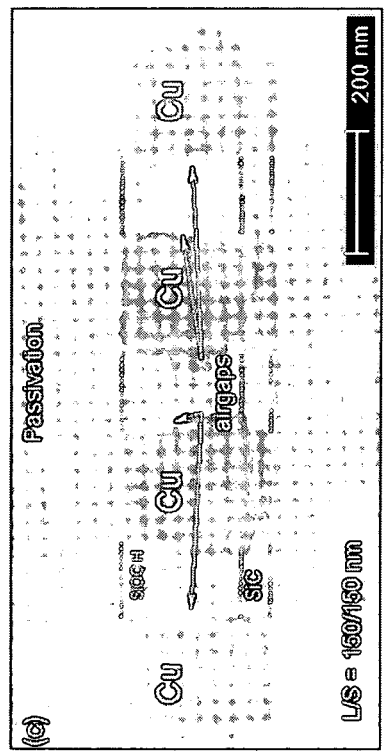

Referring now to FIGS. 10A-10C, a structure is depicted that was created by depositing Ultra Low-K (ULK) dielectric material for the dielectric material 1 and $SiO_2$ for the dielectric material 2 using standard processing. Resist patterns were created using standard resist and standard 193 nm optical lithography. In order to create a hole, the resist pattern is transferred into the dielectric stack using a standard plasma etch system. The plasma contained argon, oxygen, and fluorocarbon molecules. The resist was ashed by a plasma in a standard ash system using oxygen and fluorocarbon molecules. A TaN/Ta barrier layer 5 and conductive material 6 were deposited in the hole and on the field and subsequently removed from the field using a subtractive technique, as were previously discussed. The converted dielectric material 4 was then removed using diluted HF, which also resulted in the creation of airgaps 7 adjacent to the wires.

Example 2

Figure 7A:
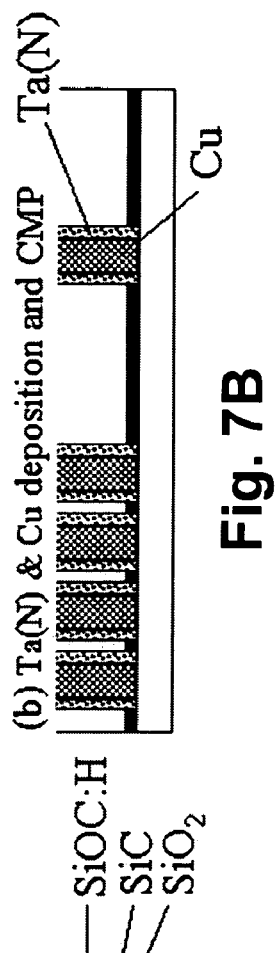
FIGS. 7A-7D are drawings that illustrate an additional process flow to illustrate the empirical examples.
Figure 7B:
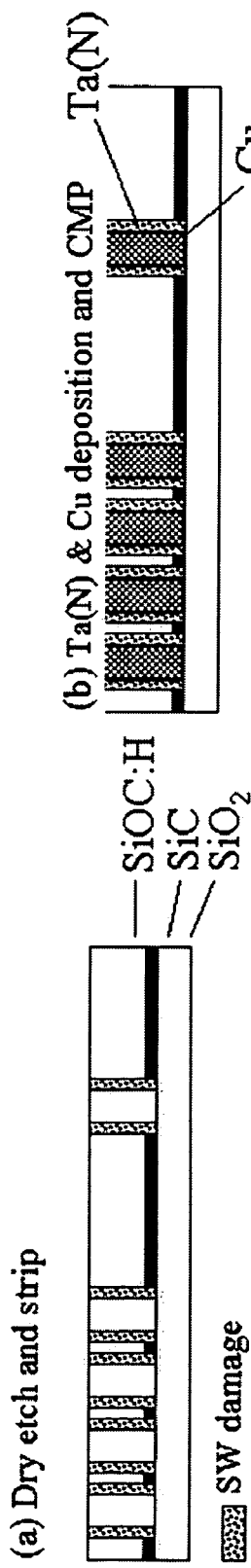

An overall process for selectively integrating airgaps is shown in FIGS. 7A-7D. In FIG. 7A, a stack including a 50/200/50/275/13 nm $Si_3N_4/SiO_2/SiC/SiOC:H/SiO_2$ was formed on a 100 Si wafer using plasma enhanced chemical vapor deposition (PE-CVD). Patterning was done using 193 nm wavelength optical lithography. Dry etch and resist ash were carried out in a Lam Exelan2300™ chamber using a $CF_4/CH_2F_2/Ar/O_2$ plasma at low pressure and an $O_2/CF_4$ plasma at high pressure, respectively. Both dry etch and resist ash processes were carefully controlled in order to induce a defective $SiO_x$ film at the sidewalls of the SiOC:H trenches, as illustrated FIG. 7A.

Figure 7D:
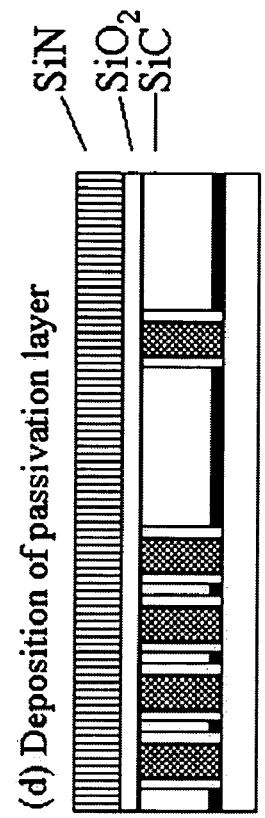
Figure 7C:
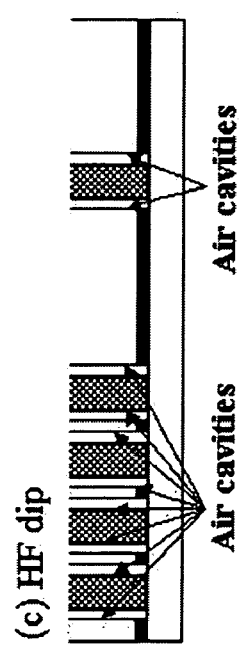

Then a 15/10 nm Ta/Ta(N) diffusion layer and a 100 nm Cu seed layer were formed using ionized physical vapor deposition (i-PVD). Trenches were filled using copper electroplating and the excessive metal was removed using chemical mechanical polishing (CMP) to produce the stack shown in FIG. 7B. HF was then used to selectively dissolve the $SiO_x$ vs. the SiOC:H, which resulted in airgap formation at sidewalls, as is depicted in FIG. 7C. The HF dip time was controlled such that the $SiO_x$ layer was removed with relatively little degradation to the SiCO:H layer, the Ta/Ta(N) diffusion barrier and the Cu conductor. Subsequently a 50/330/500 nm $SiC/SiO_2/Si_3N_4$ passivation layer was deposited on top of the layer stack, as illustrated in FIG. 7d.

Example 3

Electrical Characterization

Samples processed with and without airgaps (with the airgap formation being accomplished in the manner described in the previous example) were subjected to an electrical assessment at wafer level. The wafers designated D07, D09, D10, D11, D18, D19, D20, D21, D22 and D23 in the tables below were processed with airgap formation. All samples consisted of structures with different interconnect geometries and thus different interline spacing. More specifically, the interline spacing between different structures on the wafer was either 0.15 μm, 0.20 μm or 0.25 μm. A passivation layer was deposited on all structures of the wafers after processing except for the wafer D10. Wafer D08 did not have airgap formation and acted as a reference sample. The main characteristics of the different wafers are given in Table 1.

TABLE 1

Characteristics of processed samples.

| Wafer | HF dip time (min) | Passivation |
|---|---|---|
| D07 | 3.5 | Yes |
| D08 | 0 | Yes |
| D09 | 3.5 | Yes |
| D10 | 3.5 | no |
| D11 | 3.5 | Yes |
| D18 | 3.5 | yes |
| D19 | 3.5 | yes |
| D20 | 3.5 | yes |
| D21 | 3.5 | yes |
| D22 | 3.5 | yes |
| D23 | 3.5 | yes |

Figure 8:
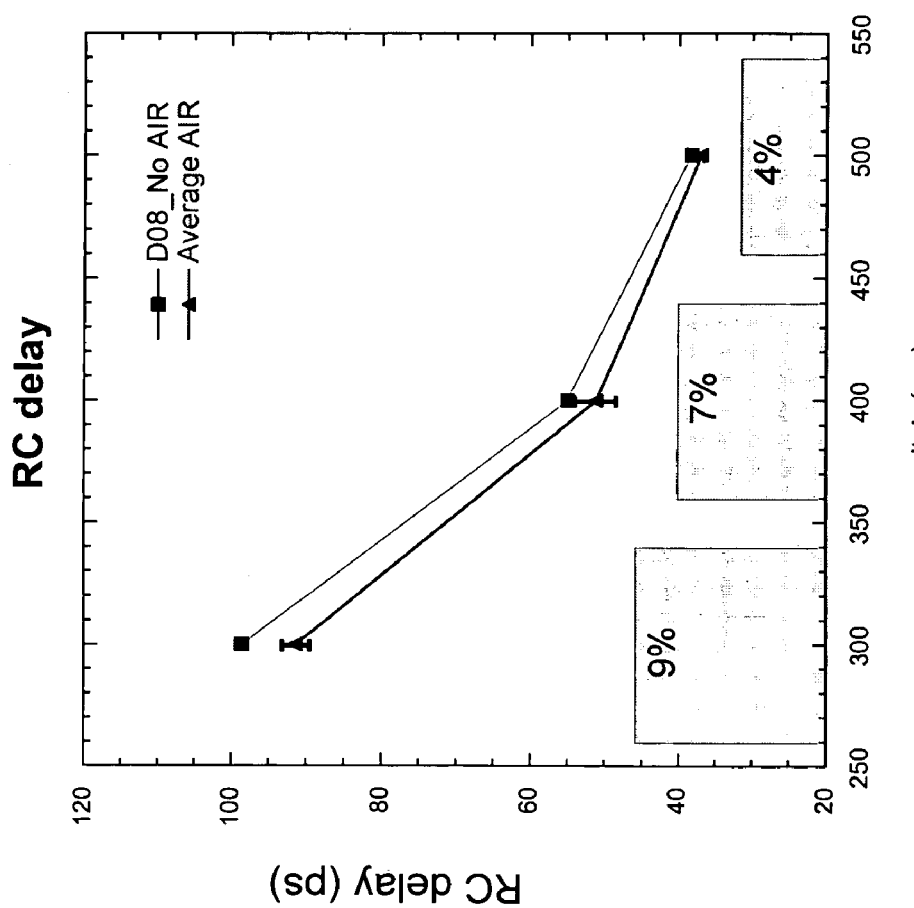
FIG. 8 is a graph that illustrates the average RC delay versus pitch size for wafers with and without airgaps, where the bars in the graph represent the RC delay drop for each pitch.
Figure 9:
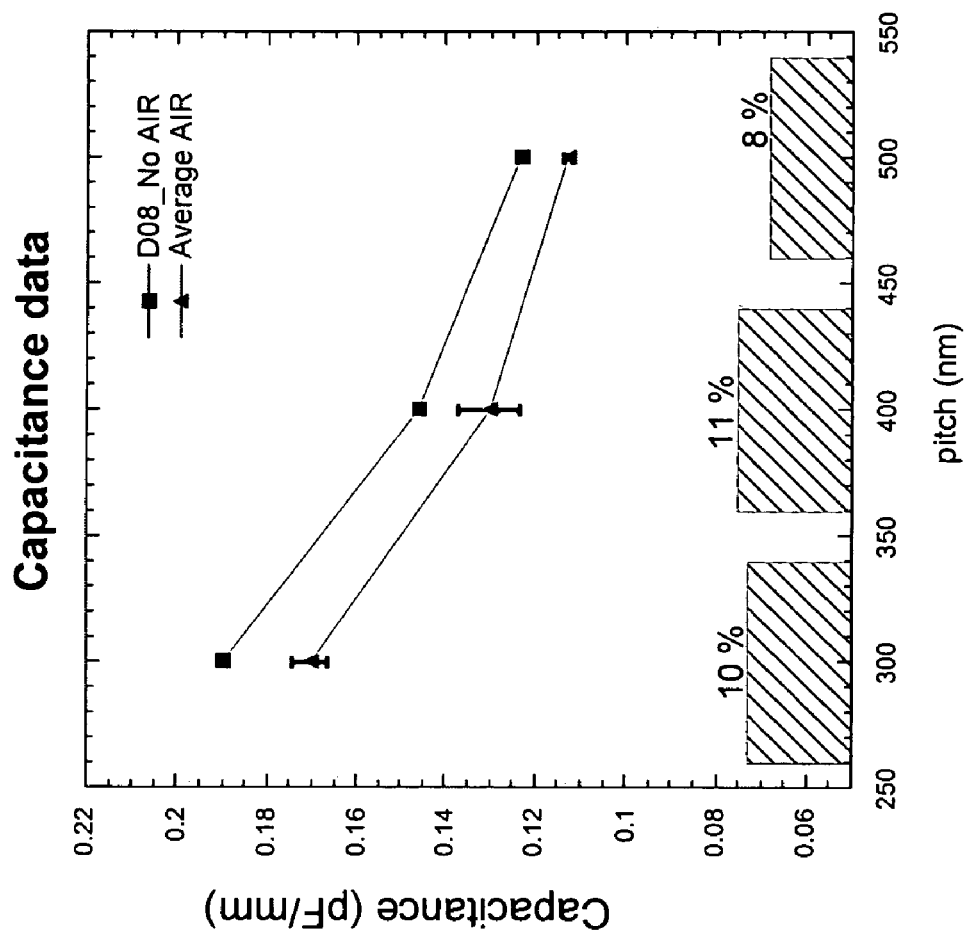
FIG. 9 is a graph illustrating average capacitance data for wafers with and without airgaps, where the bars represent the respective capacitance drop for each pitch.

Table 2 displays RC-delay data for passivated samples with airgaps, while Table 3 shows RC-delay data for samples with and without airgaps. It is important to note that the RC-delay drop strongly depends on the interline spacing as is shown by a graph of this date presented in FIG. 8. This is because the airgaps dimensions are constant for each pitch, inducing a more pronounced capacitance drop for the more closely spaced interconnect geometries, as is shown by the data in Table 4 and the graph of that data in FIG. 9.

TABLE 2

Average RC-delay for wafers with airgaps.

| RC-delay (ps) | D09 | D11 | D18 | D19 | D20 | D21 | D22 | D23 |
|---|---|---|---|---|---|---|---|---|
| 0.15/0.15 μm, | 90.973 | 91.620 | 92.911 | 93.402 | 90.283 | 88.809 | 92.044 | 90.562 |
| 0.15/0.15 μm, std. dev. | 0.730 | 0.583 | 2.909 | 2.487 | 2.058 | 1.319 | 2.488 | 1.651 |
| 0.20/0.20 μm, | 50.929 | 51.908 | 51.903 | 52.491 | 50.735 | 50.388 | 50.576 | 49.882 |
| 0.20/0.20 μm, std. dev. | 3.351 | 0.376 | 0.964 | 1.284 | 0.619 | 0.485 | 7.838 | 7.716 |
| 0.25/0.25 μm | 36.868 | 37.292 | 37.477 | 37.859 | 36.479 | 36.103 | 37.251 | 36.773 |
| 0.25/0.25 μm, std. dev. | 0.320 | 0.250 | 0.786 | 1.059 | 0.545 | 0.381 | 0.611 | 0.447 |

TABLE 3

Average RC-delay for wafers with and without airgaps.

| RC-delay (ps) | NO AIR* | AIR** | drop |
|---|---|---|---|
| 0.15/0.15 μm, | 100.517 | 91.326 | 9% |
| 0.20/0.20 μm, | 55.092 | 51.102 | 7% |
| 0.25/0.25 μm, | 38.417 | 37.013 | 4% |

*Average of 44 dies data (1 wafer)
**Average of 352 dies data (8 wafers)

TABLE 4

Average Capacitance for wafers with and without airgaps.

| Capacitance (pF/mm) | NO AIR* | AIR** | drop |
|---|---|---|---|
| 0.15/0.15 μm, | 0.190 | 0.170 | 10% |
| 0.20/0.20 μm, | 0.146 | 0.130 | 11% |
| 0.25/0.25 μm, | 0.123 | 0.113 | 8% |

*Average of 44 dies data (1 wafer)
**Average of 352 dies data (8 wafers)

Example 4

SEM Inspection of Processed Samples with Airgaps

FIG. 10 shows cross-sectional SEM images of Cu/SiOC: H/Airgaps/Passivation structures with interline spacing of L/S=150/150 nm, 200/200 nm and 250/250 nm. After analyzing several images, it was determined that the airgaps dimensions are approximately 25 to 35 nm thick and about 275 nm in height. These dimensions are similar to those of unpassivated airgap structures, meaning that the deposition of the passivation layer does not penetrate in the air cavities. The width of the airgap typically corresponds to the thickness of the SiOx film after oxidation of SiCO:H, which can be tuned during a reactive ion etch process used to etch the holes in the dielectric material.

Figure 11:
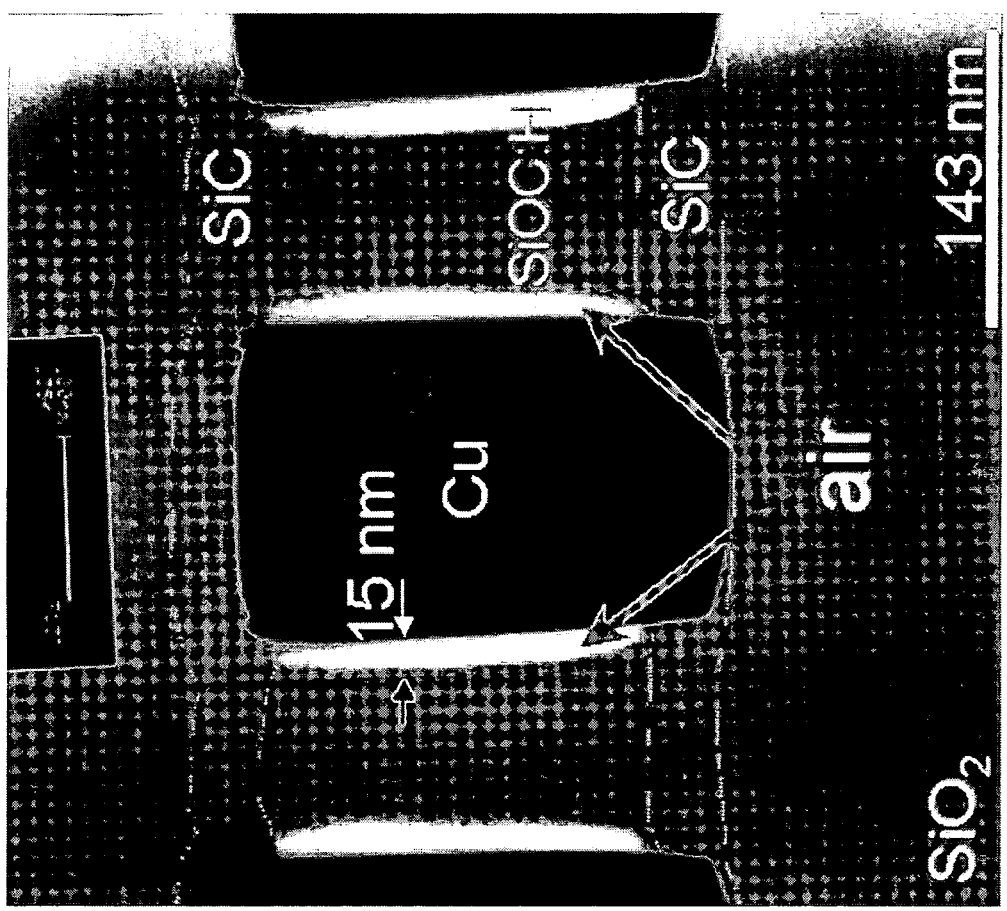
FIG. 11 is a cross-sectional TEM images of Cu/Low-k/Airgaps/Passivation structures showing airgaps with dimension of 15 nm with a SiC capping layer (passivation)
Figure 12:
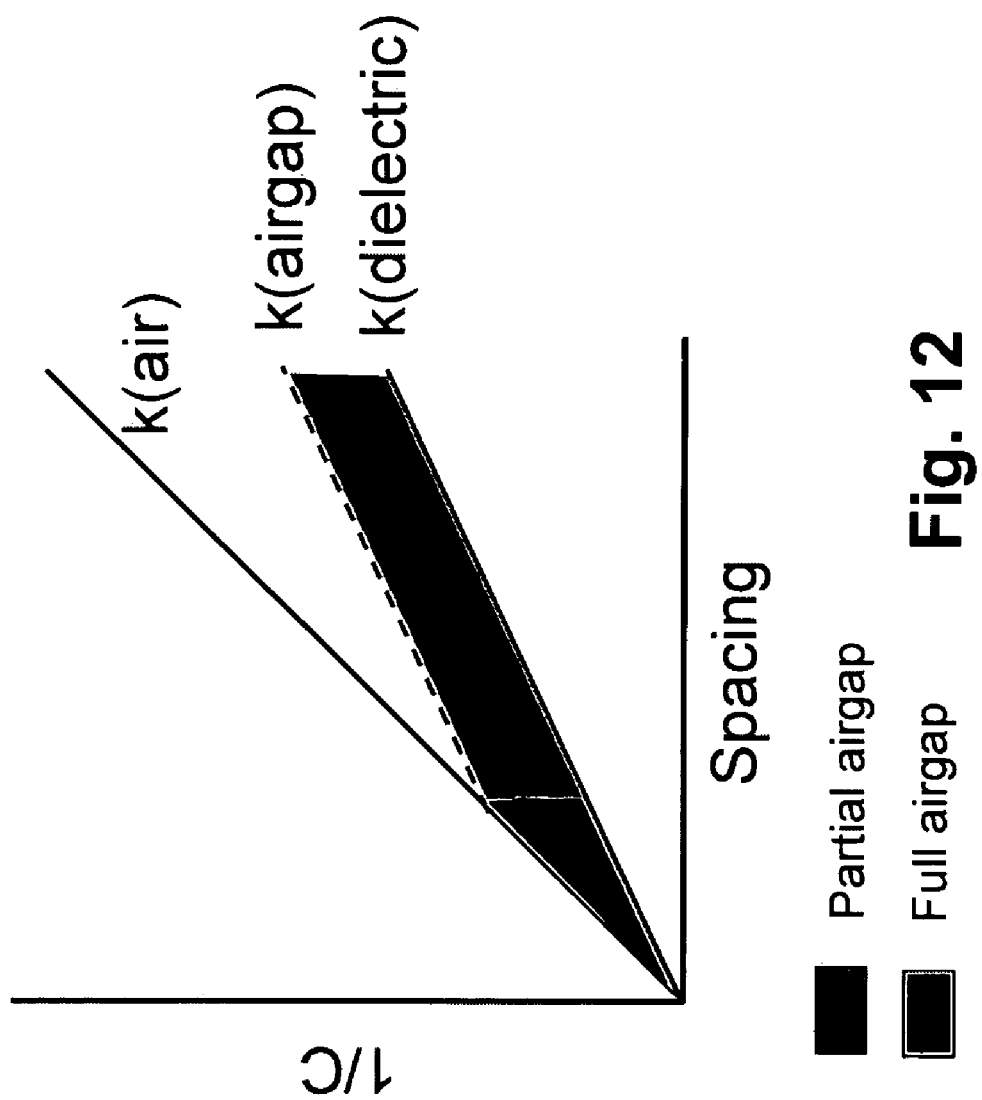
FIG. 12 is a graph illustrating the k-values of a low-k material with partial airgaps adjacent to Cu lines and full airgap formation in between Cu lines compared to the k-value of air.

FIG. 11 is a cross-sectional TEM images of Cu/Low-k/Airgaps/Passivation structures showing airgaps with dimension of 15 nm with a SiC capping layer (passivation) and FIG. 12 is a graph illustrating the k-values of a low-k material with partial airgaps adjacent to Cu lines and full airgap formation in between Cu lines compared to the k-value of air.

CONCLUSION

Various arrangements and embodiments have been described herein. It will be appreciated, however, that those skilled in the art will understand that changes and modifications may be made to these arrangements and embodiments without departing from the true scope and spirit of the present invention, which is defined by the following claims.

The invention claimed is:

1. A damascene stack for use in a semiconductor device, the damascene stack comprising:

a patterned dielectric layer including an interconnect structure, wherein the dielectric layer is formed of a dielectric material including Si, C and O;

a converted portion of the dielectric layer, wherein the converted portion is adjacent to the interconnect structure and has a lower carbon content than the dielectric material; and an airgap formed adjacent to the interconnect structure, the airgap being formed by removing at least part of the converted portion using an etch compound.

2. The damascene stack of claim 1, wherein the etch compound includes fluorine.

3. The damascene stack of claim 1, wherein the converted portion of the dielectric layer is formed by local converting the dielectric material during patterning of the interconnect structure.

4. The damascene stack of claim 3, wherein the interconnect structure is patterned using a dry etch sequence.

5. The damascene stack of claim 4, wherein the interconnect structure is patterned using an oxidizing plasma.

6. The damascene stack of claim 1, wherein the converted portion of the dielectric layer is formed in an oxidizing environment after patterning of the interconnect structure.

7. The damascene stack of claim 6, wherein the converted portion of the dielectric layer is formed after patterning of the interconnect structure using one of (i) a UV-ozone treatment and (ii) a SCCO2 treatment, the SCCO2 treatment including an oxidizer.

8. The damascene stack of claim 1, wherein the converted portion is removed using one of vapor HF and liquid HF.

9. The damascene stack of claim 8, wherein the converted portion is removed using a liquid HF solution having less than 5% HF.

10. The damascene stack of claim 1, wherein the damascene stack comprises a single damascene structure.

11. The damascene stack of claim 1, wherein the damascene stack comprises a dual-damascene structure.

12. The damascene stack of claim 1 wherein the interconnect structure is formed from a conductive material.

13. The damascene stack of claim 12, wherein the interconnect structure comprises a diffusion barrier layer.

14. The damascene stack of claim 1, wherein the interconnect structure includes a conductive line formed in a horizontal trench.

15. The damascene stack of claim 1, wherein the interconnect structure includes a via.

16. The damascene stack of claim 1, wherein the converted portion of the dielectric layer is formed prior to formation of the interconnect structure.

17. The damascene stack of claim 1, wherein removing the converted portion occurs after formation of the interconnect structure.

18. The damascene stack of claim 1, wherein the dielectric material includes SiCO(H) and the dielectric material is locally converted to a material including $SiO_x$ to form the converted portion.

19. The damascene stack of claim 1, wherein the converted portion has in plane dimensions smaller than 1 μm.

20. A damascene stack for use in a semiconductor device, the damascene stack comprising:

a patterned dielectric layer including two interconnect structures, wherein the dielectric layer is formed of a dielectric material including Si, C and O;

a converted portion of the dielectric layer, wherein the converted portion extends substantially entirely between the two interconnect structures and has a lower carbon content than the dielectric material; and at least one airgap formed between the two interconnects structures, the airgap being formed by removing substantially all of the converted portion using an etch compound.

* * * * *